US008172943B2

(12) United States Patent
Ohkubo

(10) Patent No.: US 8,172,943 B2
(45) Date of Patent: May 8, 2012

(54) SINGLE CRYSTAL MANUFACTURING METHOD

(75) Inventor: Masamichi Ohkubo, Yamaguchi (JP)

(73) Assignee: Siltronic AG, Munich (DE)

( * ) Notice: Subject to any disclaimer, the term of this patent is extended or adjusted under 35 U.S.C. 154(b) by 241 days.

(21) Appl. No.: 12/129,719

(22) Filed: May 30, 2008

(65) Prior Publication Data

US 2008/0302294 A1    Dec. 11, 2008

(30) Foreign Application Priority Data

Jun. 8, 2007  (JP) ................................ 2007-152825

(51) Int. Cl.
*C30B 15/22* (2006.01)
(52) U.S. Cl. ................. 117/32; 117/13; 117/14; 117/15; 117/30
(58) Field of Classification Search .............. 117/30, 117/32, 917, 13–15
See application file for complete search history.

(56) References Cited

U.S. PATENT DOCUMENTS

| | | | | |
|---|---|---|---|---|
| 5,306,387 A * | 4/1994 | Fusegawa et al. | | 117/28 |
| 5,359,959 A * | 11/1994 | Fusegawa et al. | | 117/13 |
| 5,792,255 A * | 8/1998 | Iino et al. | | 117/32 |
| 5,851,283 A * | 12/1998 | Hoshi et al. | | 117/32 |
| 5,980,630 A * | 11/1999 | Iino et al. | | 117/32 |
| 6,156,119 A * | 12/2000 | Hoshi et al. | | 117/30 |
| 6,607,594 B2 * | 8/2003 | Fujiwara et al. | | 117/32 |
| 6,632,280 B2 * | 10/2003 | Hoshi et al. | | 117/217 |
| 6,899,758 B2 * | 5/2005 | Abe et al. | | 117/13 |
| 7,559,988 B2 * | 7/2009 | Cho | | 117/30 |
| 7,588,638 B2 * | 9/2009 | Hisaichi | | 117/217 |
| 2002/0129759 A1 * | 9/2002 | Fujiwara et al. | | 117/33 |
| 2003/0010276 A1 * | 1/2003 | Abe et al. | | 117/13 |
| 2003/0070605 A1 * | 4/2003 | Hoshi et al. | | 117/13 |
| 2007/0028833 A1 * | 2/2007 | Abe | | 117/14 |
| 2007/0186845 A1 * | 8/2007 | Umeno | | 117/13 |
| 2009/0183670 A1 * | 7/2009 | Cho et al. | | 117/32 |

FOREIGN PATENT DOCUMENTS

EP      0745706 A1    4/1996
(Continued)

OTHER PUBLICATIONS

Derwent Abstract Corres. to WO 2002010485.
(Continued)

*Primary Examiner* — Bob M Kunemund
*Assistant Examiner* — Kenneth A Bratland, Jr.
(74) *Attorney, Agent, or Firm* — Brooks Kushman P.C.

(57) ABSTRACT

Single crystalline ingots can be stably pulled free from dislocation and with a good crystal shape by actuating a crystal driving unit so as to immerse a seed crystal in a silicon melt, and controlling the crystal driving unit and a crucible driving unit under predetermined conditions so as to pull the seed crystal. During pulling, a horizontal magnetic field positioning device applies a magnetic field in the horizontal direction to the inside of the silicon melt, fixing the magnetic field axis at a constant position from the liquid surface of the melt. Positional adjustment of the vertical position of the horizontal magnetic field is performed in advance by a magnetic field position adjusting device, and the magnetic field axis of the applied field is fixed at a constant distance lower than the liquid surface of the melt by more than 50 mm and at the same level or higher than a depth L from the melt surface at the point of tail-in.

4 Claims, 6 Drawing Sheets

| | FOREIGN PATENT DOCUMENTS | |
|---|---|---|
| JP | 08-231294 A | 9/1996 |
| JP | 08231294 A | 9/1996 |
| JP | 08-333191 A | 12/1996 |
| JP | 2004-182560 A | 7/2004 |
| JP | 2004196569 A | 7/2004 |
| JP | 2005-298223 A | 10/2005 |
| WO | 0210485 A1 | 2/2002 |

OTHER PUBLICATIONS

Patent Abstract of Japan corresponding to JP 08-231294 A.
Patent Abstract of Japan corresponding to JP 2004-182560 A.
Patent Abstract of Japan corresponding to JP 2005-298223 A.

* cited by examiner

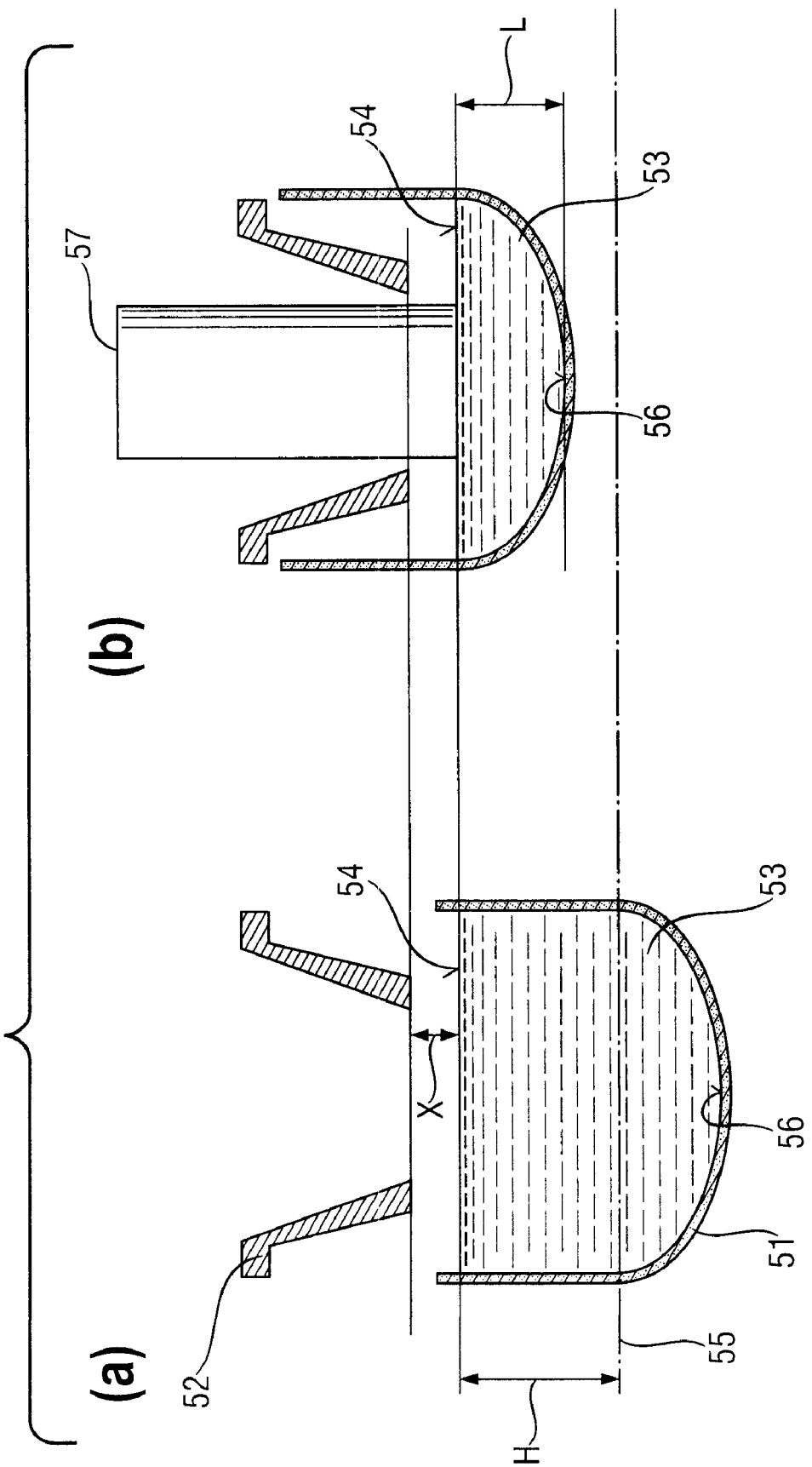

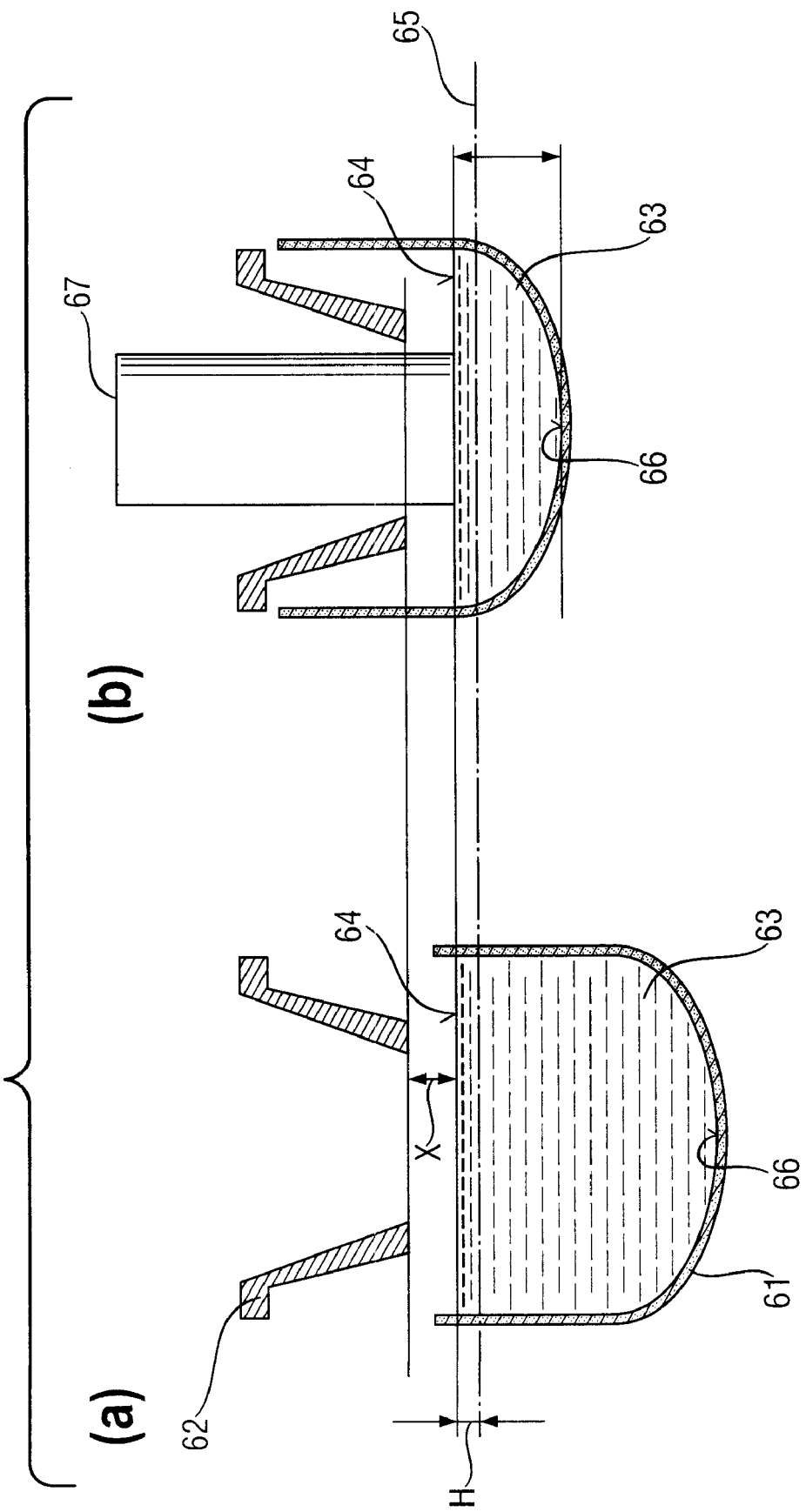

SINGLE CRYSTAL MANUFACTURING METHOD

BACKGROUND OF THE INVENTION

1. Field of the Invention

The present invention relates to a manufacturing method for single crystals using the Czochralski process (hereinafter, referred to as the CZ process) and in particular to a method for manufacturing silicon single crystals by using the MCZ process in which a horizontal magnetic field is applied to a silicon melt during pulling of the single crystal.

2. Background Art

Recently, high integration and fine structurization of elements has advanced in semiconductor devices, and accordingly improvement in the quality of the silicon single crystal substrate material has been increasingly demanded. Particularly, reduction of Grown-in defects introduced during pulling of the silicon single crystal is strongly needed. Many pulling methods for reducing these defects, for example methods for pulling a silicon single crystal in an N region, have been proposed.

In addition to improving the yield of semiconductor devices and reducing manufacturing cost of IC chips, the diameter of silicon single crystal wafers (hereinafter, simply referred to as wafers) has becomes larger. Recently, wafer diameters are mainly 300 mm, a change from the conventional 200 mm diameter formerly used. The production of 300 mm-wafers has increased rapidly.

Due to the necessity to reduce the Grown-in defects and to the increasing weight of the raw materials needed for enlarging the diameter of silicon single crystals, stability of silicon melt flow during crystal growth has become more important. More specifically, to reduce the Grown-in defects of a silicon single crystal, the shape of the crystal interface and the temperature distribution in the vicinity of the crystal interface is significantly important, and stable control of the temperature distribution in the melt is therefore required.

As the diameter of the silicon single crystal increases, an increasingly large weight of raw material is required. The diameter of the quartz crucible used for CZ crystal growth has been increased from the 22 to 24 inches used for manufacturing 200 mm-diameter silicon single crystals to 32 inches for 300 mm diameter ingots. With the increasing diameter of the quartz crucible, and also the increased weight of the filling raw material, natural convection of the silicon melt becomes strong, and it becomes necessary to stably control this natural convection.

To suppress the natural convection of the silicon melt, it has recently been proposed to apply a magnetic field to the melt. In particular, a horizontal magnetic field has been proposed for effectively suppressing the natural convection of the melt. In such horizontal magnetic field processes, there have been many proposals for more effective use of conventional magnetic field intensity, with respect to the magnetic field distribution in the silicon melt.

For example, Japanese Laid-Open (kokai) Patent Application H08-231294 discloses that change in oxygen concentration in the crystal growth direction becomes large when the longitudinal (crystal axis direction) distance between the silicon melt surface and a horizontal magnetic flux axis is larger than 5 cm, and accordingly the longitudinal distance between the silicon melt surface and the horizontal magnetic flux axis is fixed to within 5 cm to control the oxygen concentration distribution in the crystal growth direction.

Moreover, Japanese Laid-Open (kokai) Patent Application H08-333191 proposes that to enhance the uniformity of the applied magnetic field intensity and to improve the convection suppressing effect in the silicon melt over the entire crucible, the relative positions of an electromagnet and the crucible in the vertical direction is set so that the central axis of the coil coincides with the depthwise central part of the melt in the crucible or below this central part.

Moreover, Japanese Laid-Open (kokai) Patent Application 2004-182560 proposes that, in the use of a curved, saddle-shape coil, to prevent the phenomenon of rapid increase in crystal diameter, to perform stable pulling, and to avoid deterioration of the inplane oxygen concentration, the coil axis is positioned away from the raw material melt surface by 100 mm or more in depth.

Furthermore, Japanese Laid-Open (kokai) Patent Application 2005-298223 discloses reducing Grown-in defects and obtaining a high-quality crystal by positioning the magnetic field center in the range of 100 mm to 600 mm below the melt surface.

As described above, many different embodiments have been proposed for the positional relationship of the horizontal magnetic field in the silicon melt for various purposes, such as for enhancing stability of the oxygen concentration distribution or uniformity of the magnetic field strength so as to suppress the convection of the silicon melt and to reduce Grown-in defects.

When a silicon single crystal is pulled from a molten silicon in a quartz crucible, it is important to keep the crystal thermal history in the vicinity of the crystal interface constant for maintaining uniformity of both oxygen concentration and uniformity of Grown-in defects in the longitudinal direction. Therefore, in conventional CZ manufacturing equipment, the quartz crucible containing the molten silicon is raised in accordance with the weight of the pulled single crystal, so that a constant distance is maintained between an Ar baffle plate disposed at a fixed position and the molten silicon surface, in other words, the liquid surface position of the silicon melt with respect to the Ar baffle plate is maintained at the same position during the entire pulling processes.

In such a manufacturing method, the relation between the molten silicon and the center position of a horizontal magnetic field is as shown in FIG. 4. More specifically, in an initial state in which a sufficient amount of a silicon melt 43 is housed in a crucible 41, as shown in FIG. 4A, the magnetic field center position 45 of the applied magnetic field which is away from the liquid surface 44 of the silicon melt 43 in the crucible 41 by a distance H is positioned between the liquid surface 44 and a lowest part 46 of the silicon melt 43. In this state, pulling of the silicon single crystal is started, and raising of the crucible 41 is performed in accordance with the amount of the silicon single crystal 47 which has been pulled. When pulling of the silicon single crystal 47 has advanced, and the rise of the crucible 41 becomes K, as shown in FIG. 4B, the lowest part 46 of the silicon melt 43 reaches the magnetic field center position 45. When the pulling has further advanced, as shown in FIG. 4C, the lowest part 46 of the silicon melt 43 is positioned above the magnetic field center position 45.

In the manufacturing method shown in FIG. 4, the effects of the magnetic field exerted on the silicon melt is thus largely different between the states illustrated in FIGS. 4A, 4B, and 4C.

When the relation between the liquid surface 44 of the silicon melt 43 and the magnetic field center position 45 passes through the state of FIG. 4B and attains the state of FIG. 4C in which the symmetrical property in the vertical direction about the magnetic field center position 45 of the silicon melt 43 is lost, numerous problems influence the silicon melt 43 and the silicon single crystal 47 during pulling, as described hereinafter.

More specifically, when the magnetic field center position 45 of the applied magnetic field is lower than the lowest part 46 of the silicon melt 43 in the crucible 41 (state of FIG. 4C), the temperature of the silicon melt is periodically changed. As a result, the diameter of the pulled silicon single crystal is periodically changed in the longitudinal direction, and can become smaller than the predetermined diameter, which causes yield reduction in the manufacture of the silicon single crystal ingots. To prevent this reduction in diameter below specification, it is conceivable to increase the target diameter of the manufactured silicon single crystal ingot in advance. However, increasing the target diameter also reduces yield due to the increased diameter elsewhere, and thus this method cannot prevent reduced yield.

Moreover, in the state of FIG. 4C, the rotational speed of the crucible 41 may be decreased to lower oxygen concentration, and the magnetic field may be enhanced to further suppress natural convection of the silicon melt. However, under such crystal pulling conditions, as a unique phenomenon associated with use of a horizontal magnetic field, part of the molten silicon surface solidifies in low-temperature regions of the silicon melt surface, the solidified silicon ultimately contacts the single crystal during pulling, and causes dislocations in the pulled crystal. Therefore, all the crystal pulling conditions described above cause yield reduction in silicon single crystal manufacture.

Moreover, when a magnetic center position 55 of an applied magnetic field is at a deep position of a silicon melt 53 in an initial state like Patent Document JP2004-182560 or JP2005-298233 (see FIG. 5A), the state of FIG. 4C is already attained as shown in FIG. 5B before completion of the pulling of the straight body ("constant diameter") part of the silicon single crystal 57, that is, before tail-in. From the middle of the constant diameter pull, after the lowest part 56 of the silicon melt 53 reaches the magnetic field center position 55 (see FIG. 4B), and until the beginning of tail-in (FIG. 5B), the crystal diameter is cyclically changed, part of the surface of the molten silicon is solidified and brought into contact with the crystal during pulling, causing dislocations, with a concomitantly large decrease in yield.

When the magnetic field center position 65 of an applied magnetic field is set at a shallow position, for example, a position that is within 5 cm from the liquid surface 64 of a silicon melt 63 as in H08-231294 (see FIG. 6A), generally, a depth L from the liquid surface 64 of the silicon melt 63 remaining in the crucible 61 at the point of tail-in is larger than 5 cm, and the crystal pulling process is completed without generating the above described states of FIG. 4B to FIG. 4C, as shown in FIG. 6B. Therefore, during the crystal pulling process, the temperature of the silicon melt is not periodically changed, and no reduction in yield due to periodical change of crystal diameter below specification in the longitudinal direction is experienced.

However, when the magnetic field center position is too close to the liquid surface of the silicon melt like the case of FIG. 6A, the phenomenon of unstable silicon melt flow appears. Particularly when the weight of the silicon melt is large, this phenomenon becomes serious. At the beginning of the silicon single crystal pulling step, in other words, in the necking step, the diameter increasing (cone) step, and the constant diameter step, the temperature of the silicon melt becomes unstable, and crystal dislocations are generated. As a result, it has been necessary to repeat the process of melting the dislocated crystal again and performing pulling. Therefore, productivity of a silicon ingot is reduced significantly. Also in the case in which the distance between the liquid surface of the silicon melt and the magnetic center position is large, the convection of the silicon melt also becomes unstable, and a similar problem occurs.

On the other hand, to enhance the uniformity of the magnetic field strength of the applied magnetic field, as described in H08-333191, it is proposed that the relative positions of the electromagnet and the crucible in the vertical direction is set so that the center axis of the coil goes through the depthwise center part of the melt in the crucible or below of the center part. According to this method, when the weight of the silicon melt is large, the central axis of the coil is below the depthwise center of the silicon melt, and the central axis of the coil is never below the lowest part of the silicon melt even at the end of the pulling step. Therefore, such a method can be conceived to be an effective method for solving the above described problems.

However, in such method, the remaining amount of the silicon melt is reduced as pulling of the crystal advances; accordingly, the distance from the liquid surface of the silicon melt in the crucible to the coil center axis is gradually reduced, and the magnetic field distribution applied to the molten silicon in the vicinity of the part immediately below the crystal interface is changed through all the pulling steps of the crystal. Therefore, stability of the magnetic field strength applied to the molten silicon cannot be obtained.

As described above, in the conventional manufacturing methods of the silicon single crystal, to achieve stabilization of the flow of the molten silicon, particularly stabilization of the molten silicon flow in the vicinity of the region immediately below the crystal interface which directly affects stabilization of silicon single crystal growth, the intensity distribution of the magnetic field applied to the crystal in this region has been required to be controlled so as always to be constant.

SUMMARY OF THE INVENTION

It is an object of the present invention to provide a manufacturing method for single crystals, which stably pulls a single crystal completely free from dislocations, and with a good crystal shape. These and other objects are achieved by a manufacturing method for single crystals by single CZ crystal growth while applying a horizontal magnetic field to the raw material melt, wherein the magnetic field center is positioned lower than the liquid surface of the melt by more than 50 mm and at a distance equal to or less than a depth L from the liquid surface of the melt remaining in the crucible during pulling of the constant diameter part of the single crystal. In a preferred mode, the magnetic field center is set at a position between 50 mm to 90 mm from the liquid surface.

BRIEF DESCRIPTION OF THE DRAWINGS

FIG. 2 are drawings for explaining the manufacturing method of the single crystal according to the present embodiment, wherein FIG. 2A shows the relation between a liquid surface of a silicon melt and a magnetic field axis at the beginning of a pulling step, and FIG. 2B shows the relation between the liquid surface of the silicon melt and the magnetic field axis at the point of tail-in.

FIG. 5 are drawings schematically showing another conventional manufacturing method of a silicon single crystal.

FIG. 6 are drawings schematically showing another conventional manufacturing method of a silicon single crystal.

DETAILED DESCRIPTION OF THE PREFERRED EMBODIMENTS

Thus, according to the present invention, the center position of the horizontal magnetic field is set at a position which is lower than the liquid surface of the raw material melt by more than 50 mm and at a distance equal to or less than the depth L from the liquid surface of the raw material melt remaining in the crucible while pulling of the constant diameter part of the single crystal is completed. As a result, unstable convection of the raw material melt in an early stage of crystal pulling can be suppressed, thereby suppressing generation of dislocations in the pulled single crystal. In addition, at least until pulling of the constant diameter part of the single crystal is completed, the center position of the magnetic field is not set below the lowest part of the raw material melt, and thus changes in the diameter of the crystal due to temperature change of the melt are suppressed, solidification of the raw material melt is suppressed, and generation of dislocations in the single crystal is suppressed. Therefore, in the inventive process, single crystals which are totally free from dislocations and have a good crystal shape can be stably pulled. As a result, the yield and productivity of single crystal manufacturing is improved. Moreover, since the magnetic center is set at a position between 50 mm to 90 mm below the liquid surface, the above described effects can be repeatably obtained.

The present inventor has diligently carried out studies to achieve the above described objects and, as a result, has discovered that during a single crystal manufacturing from a raw material melt while applying a horizontal magnetic field to the melt housed in a crucible in the CZ process, when the magnetic field center of the horizontal magnetic field is set at a position that is below the liquid surface of the melt by more than 50 mm and at a distance of a depth L or less from the liquid surface until completion of constant diameter growth, preferably in the range that is >50 mm to about 90 mm below the liquid surface, a single crystal which is completely free from dislocations and which has a good shape can be stably pulled.

The present invention has been accomplished based on the results of the above described studies. Hereinafter, embodiments of the present invention will be described with reference to drawings. Note that, the present invention is not limited to the embodiments described below.

Figure 1:
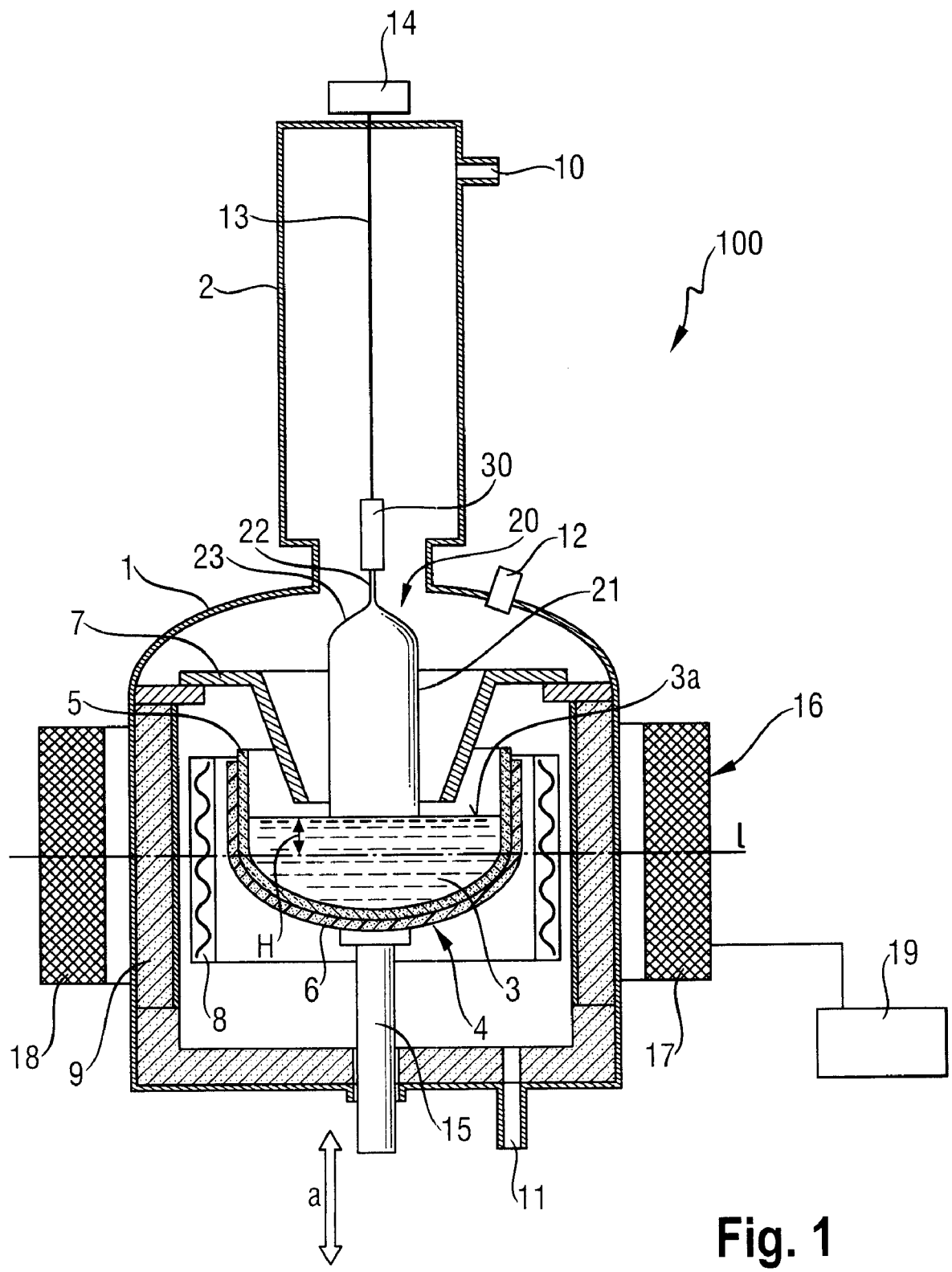
FIG. 1 is a schematic cross sectional drawing of a single crystal manufacturing apparatus suitable for carrying out a manufacturing method of a single crystal according to an embodiment of the preset invention.

FIG. 1 is a schematic cross sectional drawing of a single crystal manufacturing apparatus suitable for carrying out manufacturing methods of single crystals according to one embodiment of the present invention. The single crystal manufacturing apparatus 100 in this embodiment has, as shown in FIG. 1, a pulling chamber 1 having a cylindrical shape and a crystal take-out chamber 2 which is concentrically disposed above the pulling chamber 1, has a diameter smaller than the pulling chamber 1, and has a cylindrical shape.

The pulling chamber 1 has a crucible 4 disposed at a center part of the interior thereof for housing a silicon melt 3 serving as a raw material melt. The crucible 4 has a double structure, comprising a quartz crucible 5 at the inner side and a graphite crucible 6 at the outer side, and connects to a crucible driving unit 15 at the bottom. The crucible driving unit 15 drives and controls the position of the crucible 4 in the vertical direction so that the position of a liquid surface 3a of the silicon melt 3 in the crucible 4 is always constant in the pulling chamber 1 during pulling of a silicon single crystal, which is described below. In addition, in the pulling chamber 1, outside the crucible 4, heaters 8 are disposed so as to surround the crucible 4. Furthermore, in the pulling chamber 1, thermal insulation materials 9 are provided on the peripheral wall inner surfaces and the bottom inner surface.

Above the crucible 4, an approximately circular-cone trapezoidal Ar gas current plate 7 for regulating the flow of an introduced inert gas such as an Ar gas may be disposed so as to cover the crucible 4, and an Ar gas discharge opening 11 for discharging the introduced Ar gas provided below the crucible 4. Furthermore, in the pulling chamber 1, for example at an upper part thereof, a diameter controlling camera 12 for monitoring and controlling the crystal diameter of a pulled silicon single crystal is provided.

The crystal take-out chamber 2 has, in the interior thereof, a wire 13 which goes through the crystal take-out chamber 2, and a seed crystal 30 is attached to the lower end of the wire 13. The upper end of the wire 13 is connected to a crystal driving unit 14 disposed above the crystal take-out chamber 2. The crystal driving unit 14 causes the seed crystal 30 to be movable in the vertical direction via the wire 13 to pull the silicon single crystal.

At an upper part in the crystal take-out chamber 2, for example, an Ar gas inlet 10 for introducing an inert gas such as an Ar gas into the chambers 1 and 2 is provided, and an Ar gas feeding device, which is not shown, is connected to the Ar gas inlet 10.

As shown in FIG. 1, the single crystal manufacturing apparatus 100 has a horizontal magnetic field device 16 for generating a horizontal magnetic field. The horizontal magnetic field device 16 has a pair of coils 17 and 18. The pair of coils 17 and 18 are directed in the horizontal direction so that the axes of the respectively generated magnetic fields are orthogonal to the center axis of the pulling chamber 1 and disposed symmetrically so as to sandwich the pulling chamber 1 from outside of the side walls thereof and be opposed to each other. Thus, a horizontal magnetic field is generated in the pulling chamber 1.

Furthermore, the single crystal manufacturing apparatus 100 has a horizontal magnetic field adjusting device 19 which causes the horizontal magnetic field device 16 to be movable in the vertical direction (directions of arrow a of FIG. 1) along the center axis of the pulling chamber 1 in order to perform positional adjustment in the vertical direction of the horizontal magnetic field device 16 with respect to the crucible 4.

Figure 2:
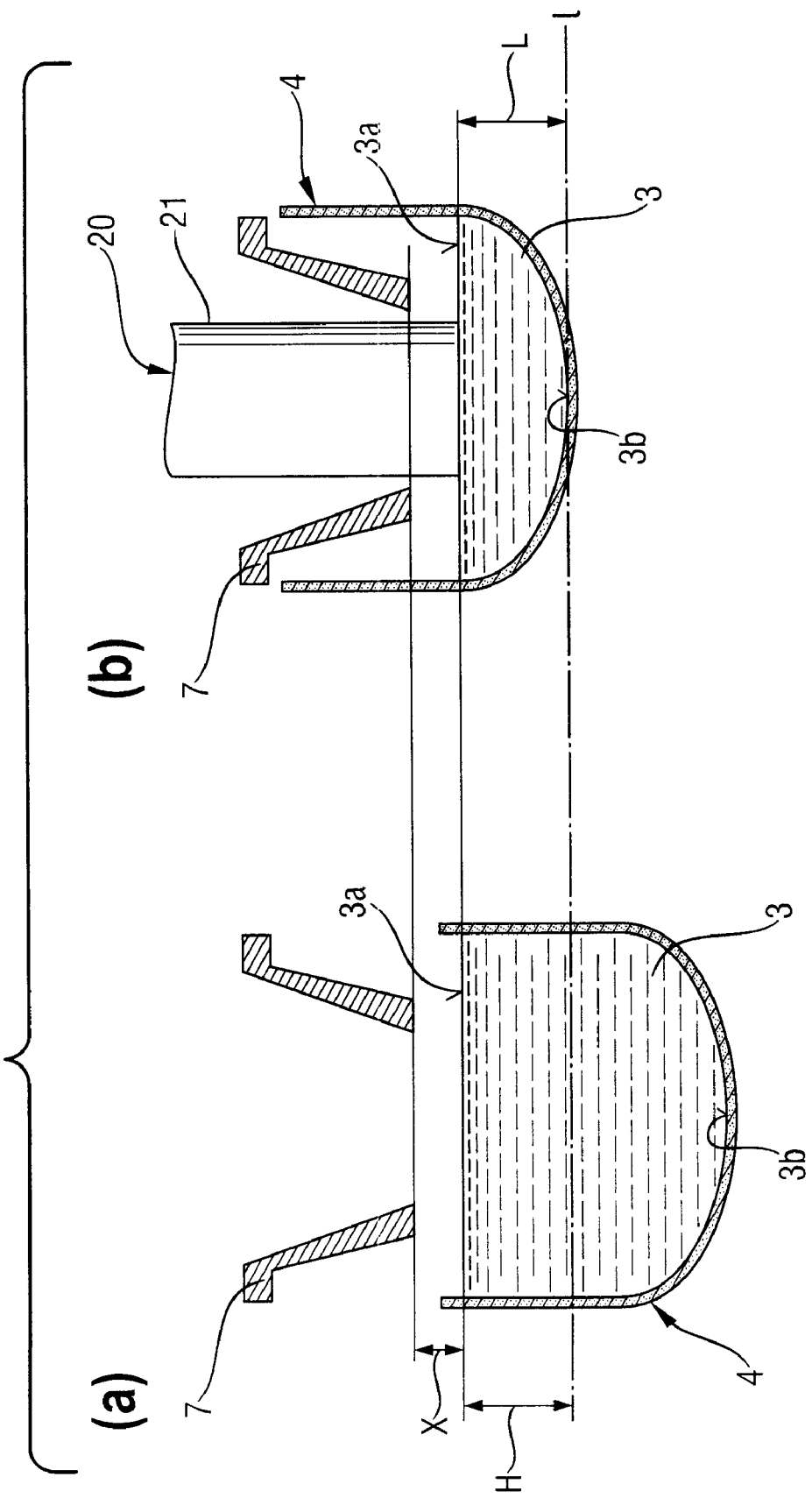

The horizontal magnetic field device 16 is subjected to positional adjustment by the horizontal magnetic field position adjusting device 19 so that the vertical-direction distance H from the magnetic field axis 1 which is an axis of the generated magnetic field to the liquid surface 3a of the silicon melt 3 in the crucible 4 is a constant value which is larger than 50 mm and equal to or less than a depth L from the liquid surface 3a of the silicon melt 3 which is remaining in the crucible 4 when pulling of the constant diameter part 21 of the silicon single crystal 20 is completed, in other words, at the beginning of tail-in (see FIG. 2B). In other words, based on manufacturing conditions such as pulling conditions, the pair of coils 17 and 18 of the horizontal magnetic field device 16 is subjected to positional adjustment and fixed by the horizontal magnetic field position adjusting device 19 such that during pulling of the silicon single crystal, the magnetic field axis 1 of the generated magnetic field is at a constant position below the liquid surface 3a of the silicon melt 3 in the crucible 4, specifically, a position lower therefrom by more than 50 mm and positioned at a point which is equal to or higher than the depth L from the liquid surface of the remaining silicon melt at the point of tail-in.

The manufacture of a single crystal according to one embodiment of the invention by using the above described single crystal manufacturing apparatus 100 will now be described.

The inside of the pulling chamber 1 and the crystal take-out chamber 2 are adjusted to a predetermined pressure, and an Ar gas is introduced into the chambers 1 and 2 at a predetermined flow rate from the Ar gas inlet 10. Then, polycrystalline silicon serving as the raw material fill for the crucible 4 is heated by heaters 8 to a predetermined temperature, and melted to generate the silicon melt 3. Then, the crystal driving unit 14 is actuated so as to immerse the seed crystal 30 in the silicon melt 3, and the crystal driving unit 14 and the crucible driving unit 15 are controlled under predetermined conditions so as to perform a pulling of the seed crystal 30.

In the pulling step, the horizontal magnetic field device 16 is driven so as to apply a horizontal magnetic field to the inside of the silicon melt 3 in the crucible 4. The horizontal magnetic field device 16 fixes the magnetic field axis I of the applied magnetic field at a constant position from the liquid surface 3a of the silicon melt 3 in the above described manner. More specifically, based on the pulling conditions, positional adjustment of the horizontal magnetic field device 16 in the vertical direction is performed in advance by the horizontal magnetic field position adjusting device 19 so that the magnetic field axis 1 of the applied magnetic field is fixed at a position that is lower than the liquid surface 3a of the silicon melt 3 by more than 50 mm and at a constant distance (magnetic field center distance H) which is higher than or equal to the depth L from the liquid surface of the remaining silicon melt at the point of tail-in.

Through this pulling step, the silicon single crystal 20 is pulled; a neck part 22, a diameter-increasing part 23, a constant diameter part 21, and a tail part which is not shown are sequentially formed; and a silicon single crystal ingot is thus produced. The depth L from the liquid surface of the remaining silicon melt at the point of tail-in uses, for example, a value which is set in advance by calculations, and the like.

The remaining portions of the manufacturing method of the single crystal according to the invention is similar to a conventional manufacturing method of a single crystal; therefore, detailed descriptions thereof will be omitted. The magnetic field center distance H which is the distance from the liquid surface 3a of the silicon melt 3 in the crucible 4 to the magnetic field axis of the applied magnetic field will now be described.

A maximum value of the magnetic field center distance H is set to a value so that the magnetic field axis 1 at the point of tail-in is overlapped with the lowest part 3b of the silicon melt 3 remaining in the crucible 4, in other words, the remaining depth L from the liquid surface 3a of the silicon melt 3 when the state shown in FIG. 2B is attained at the point of tail-in is set as the maximum value of the distance H. The reason for this is that by this set condition, the position of the magnetic field axis 1 can be maintained constant with respect to the liquid surface 3a of the silicon melt 3 from the beginning until tail-in in the pulling step, and the convection of the silicon melt 3 in the vicinity of the part immediately below the crystal interface can be maintained in a stable state. In addition, during the entire pulling step of the constant diameter part, the magnetic field axis 1 can be caused to be always above the lowest part 3b of the silicon melt 3 in the crucible 4 (see FIG. 2A). As a result, generation of conventional problems, for example, change of the crystal diameter of the pulled silicon single crystal and generation of dislocation due to solidification of the silicon melt can be prevented.

Figure 4:
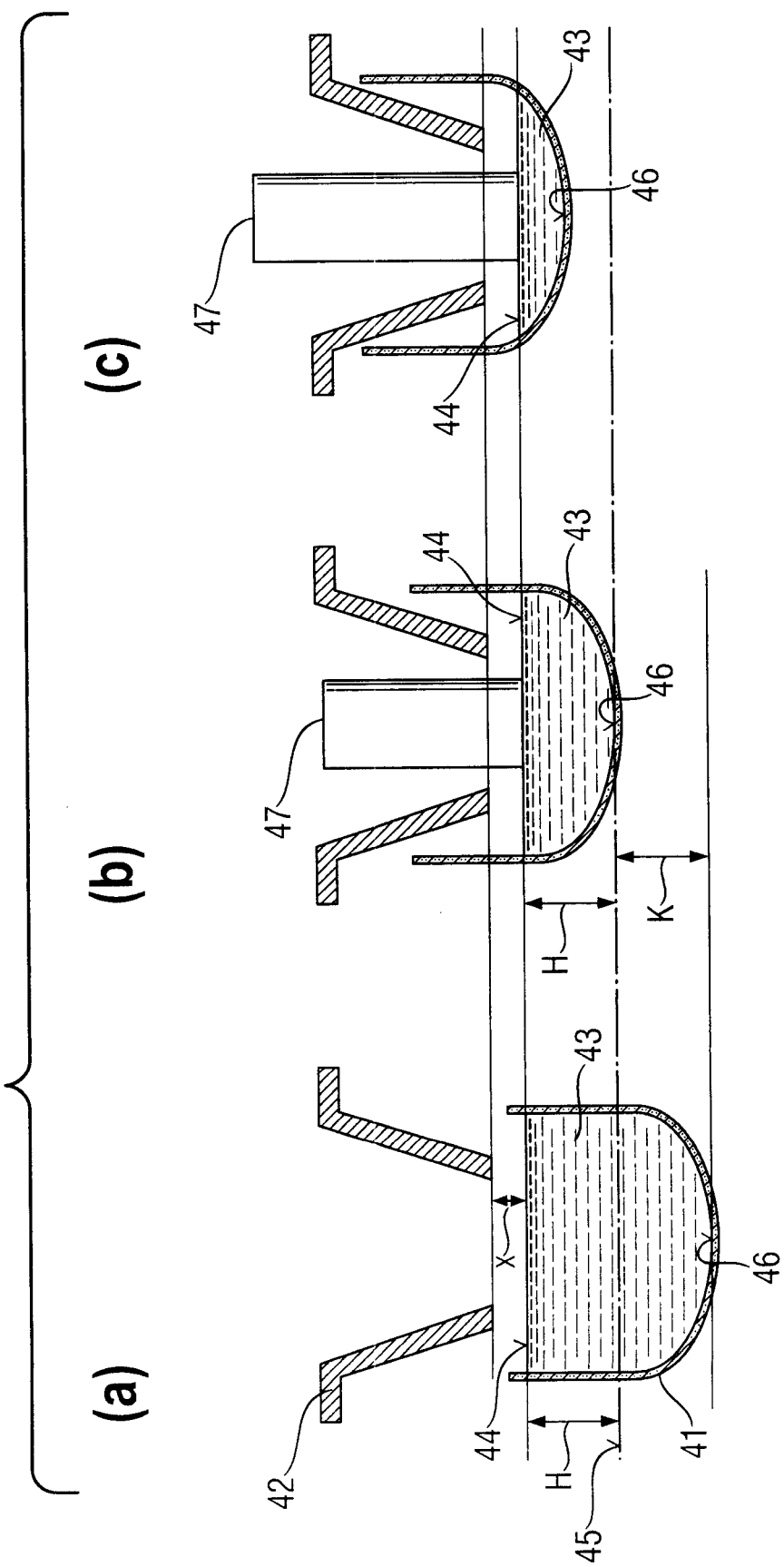
FIG. 4 are drawings schematically showing a conventional manufacturing method of a silicon single crystal.

After the tail-in, a tail step of forming the tail part is started; and, in the tail step, the magnetic field axis 1 is sometimes below the lowest part 3b of the silicon melt 3 in the crucible 4 (see FIG. 4C). However, even when change of the crystal diameter occurs in the tail part, it is not related to the yield of the manufactured silicon single crystal ingot at all, and there is no practical detriment.

Furthermore, in the tail step, since the temperature of the silicon melt is increased by increasing the output of the heaters 8 in order to reduce the crystal diameter and form the tail part, the molten silicon does not solidify, and the problem of generation of dislocations due to solidification of molten silicon and contact of this solid silicon with the ingot does not occur during formation of the tail part.

If the maximum value of the magnetic field center distance H is set to be the remaining depth of the silicon melt 3 remaining in the crucible 4 at the point when the tail part is completed, in other words, when the pulling step is entirely finished, the value of the magnetic field center distance H becomes a significantly small value that is, for example, 50 mm or less as in H08-231294, the flow of the silicon melt becomes unstable in an early stage of the pulling step as described above, the temperature distribution becomes unstable, and crystal dislocation occurs. Therefore, such condition deteriorates the productivity of the single crystal and is not effective.

Note that, although the remaining depth L of the silicon melt at the termination of pulling of the constant diameter part of the silicon single crystal (point of tail-in) is changed depending on specifications such as the initial fill of the silicon melt, the size of the quartz crucible, and the resistivity of the silicon single crystal, general values of the remaining depth L are shown in below Table 1 for reference. In Table 1, the sizes of the quartz crucibles are 28 inches and 32 inches, the solidification rate at the point of tail-in in the 28-inch crucible is set to 80%, and the solidification rate at the point of tail-in in the 32-inch crucible is set to 80% and 85%, so as to calculate the remaining depth L. Note that, when the solidification rate at the point of tail-in is further increased over the above described rates, formation of the tail part becomes difficult; therefore, the above described values are preferred.

TABLE 1

| QUARTZ CRUCIBLE SIZE | INITIAL FILLING AMOUNT | SOLIDIFICATION RATE AT TAIL-IN | REMAINING WEIGHT | REMAINING DEPTH L |
|---|---|---|---|---|
| 28 INCHES | 200 kg | 80% | 40 kg | 90 mm |
|  | 240 kg | 80% | 48 kg | 99 mm |
| 32 INCHES | 300 kg | 80% | 60 kg | 105 mm |
|  |  | 85% | 45 kg | 90 mm |
|  | 350 kg | 80% | 70 kg | 115 mm |
|  |  | 85% | 52.5 kg | 96 mm |

As is understood from above Table 1, although values are slightly different depending on the pulling conditions, the remaining depth L of the silicon melt at the point of tail-in has a value equal to or more than 90 mm and equal to or less than 115 mm.

As described above, in the manufacturing method of the invention, from the initiation of the pulling step until at least the point of tail-in, the magnetic field axis 1 of the applied horizontal magnetic field is always in the silicon melt, and the horizontal magnetic field is applied so that the magnetic field axis 1 of the horizontal magnetic field goes into the inside of the silicon melt 3 in the crucible 4 at a position having a constant distance from the liquid surface 3a of the silicon melt 3, in other words, at a distance larger than 50 mm and equal to less than the remaining depth L (see FIG. 2A and 2B).

EXAMPLES

Hereinafter, examples of the present invention will be described.

Pulling of a silicon single crystal was carried out by the above described embodiment by using the single crystal manufacturing apparatus 100 of FIG. 1. Specifically, when the magnetic field center distance H was 60, 70, and 90 mm, pulling of silicon single crystal ingots was carried out, respectively, so that the number of the ingots were: n=4 when H=60 mm, n=4 when H=70 mm, and n=3 when H=90 mm (Examples 1 to 3).

In the present examples, the diameter of the quartz crucible 5 was 28 inches (700 mm), based on specifications such as desired resistivity, in order to manufacture a silicon single crystal ingot in which constant diameter length is 1000 mm, and the crystal diameter of the constant diameter part is 306 mm, to take into consideration a grinding allowance in subsequent cylindrical grinding so that the crystal diameter of the complete product would be 300. 220 kg of block polycrystalline silicon was prepared as a raw material to fill the interior of the crucible 4.

When the silicon single crystal ingot having the above described desired shape is pulled, the weight of the single crystal silicon pulled at the point of tail-in is expected to be 177 kg; and, since the remaining amount of the silicon melt remaining in the crucible 4 at this point is 43 kg, the remaining depth L of the silicon melt at the point of tail-in is expected to be 94 mm.

By using the horizontal magnetic field position adjusting device 19, the horizontal magnetic field device 16 was moved and fixed so that the magnetic field center distance H is 60, 70, and 90, respectively (see FIG. 2A).

Next, the prepared 220-kg polycrystalline silicon block was placed in the quartz crucible 5, and the polycrystalline silicon block was melted by the heaters 8 while introducing the Ar gas from the Ar gas inlet 10 into the chambers 1 and 2 and discharging the gas from the Ar gas discharge opening 11 by using a vacuum pump.

After completion of melting of the polycrystalline silicon block, a magnetic field was not applied for a while, and positioning was carried out by moving the crucible 4 by driving the crucible driving unit 15, thereby adjusting a distance X between the Ar gas current plate 7 and the liquid surface 3a of the silicon melt 3 (see FIG. 2A) to a predetermined value. Then, after several hours of silicon melt temperature stabilizing time for adjustment of the temperature required in the next step, a magnetic field of 3000 G was applied to the silicon melt 3 in the crucible 4 by using the horizontal magnetic field device 16 at the magnetic field center positions 60, 70, and 90 mm, respectively.

To eliminate dislocation of the seed crystal in the necking step, necking by the dash method was carried out a diameter-increased part was formed in the diameter-increasing step so that the crystal diameter became predetermined size 306 mm, and pulling was then changed to a constant diameter pull to form the constant diameter part, and pulling was carried out until the straight body part became 1000 mm in length.

The weight of the silicon single crystal at the point of tail-in was 6 kg at the diameter-increased part, 171 kg at the constant diameter part, and 177 kg in total. In consideration of the above described expected remaining depth L=94 mm at the point of tail-in, the magnetic field center line 1 in the Examples 1, 2, and 3 is at the positions higher than the lowest part of the silicon melt by 34 mm, 24 mm, and 4 mm, respectively.

Finally, a tail part was formed in a weight of 23 kg, a silicon single crystal ingot having a total weight of 200 kg was thus generated, and the pulling step was finished. The remaining amount of the silicon melt at the point of the pulling step completion was 20 kg. In the above described pulling step, crystal pulling was carried out in the N region, and the pulling speed was 0.50 mm/min.

During pulling of the silicon single crystal, when dislocations are generated in an early stage, for example the necking step, diameter-increasing step, or constant diameter step, the pulled silicon single crystal must be returned into the crucible again and melted, and pulling repeated. The number of total pulling steps are divided by the number of different melts gives an average pull try per batch. The number of tries was 1.25 in Example 1, 1 in Example 2, and 1.33 in Example 3. Note that, in each of Examples 1, 2, and 3, the silicon melt did not solidify, and the crystal shape was good. In Example 3, the shape of the crystal was particularly good.

The average of the cycle time for generating one good silicon single crystal ingot was 72 hr, 70 hr, and 73 hr, respectively, in Examples 1, 2, and 3.

As comparative examples, merely the magnetic field center distances were changed with respect to the above described examples, and n=2 silicon single crystal ingots were generated in the same manner. Specifically, when the magnetic center distance H was 150, 25, and 40 mm, n=2 silicon single crystal ingots were pulled in each case (Comparative Examples 1 to 3).

In Comparative Example 1, dislocation occurred during the process in first and second pulling steps in pulling of both the silicon single crystal ingots, and a good silicon single crystal ingot was pulled in a third pulling process.

In Comparative Example 1, in pulling of both the silicon single crystal ingots, pulling of a single crystal free from dislocation was smoothly started; however, change of the crystal diameter periodically appeared from the point when the length of the straight body part was 700 mm when the magnetic field center line 1 became lower than the lowest part of the silicon melt. This generated a remained unground part which did not satisfy desired crystal diameter 300 when it was ground cylindrically. Moreover, at the point when the length of the straight body part was 980 mm, part of the surface of the silicon melt solidified, and the solidified part was brought into contact with the silicon single crystal, thereby generating dislocations. As a result, dislocations were generated across 150 mm which was 15% of the entire straight body part. In Comparative Example 1, the average cycle time was 78.3 hr.

Meanwhile, in Comparative Example 2, in pulling of both the silicon single crystal ingots, dislocations were generated in formation of a shoulder part in first, second and third pulling processes, and good silicon single crystal ingots were formed in a fourth pulling process. The average value of the cycle time was 85.9 hr.

In Comparative Example 3, in average, good silicon single crystal ingots were formed in 2.5 times of pulling processes. The average value of the cycle time was 78 hr.

Figure 3:
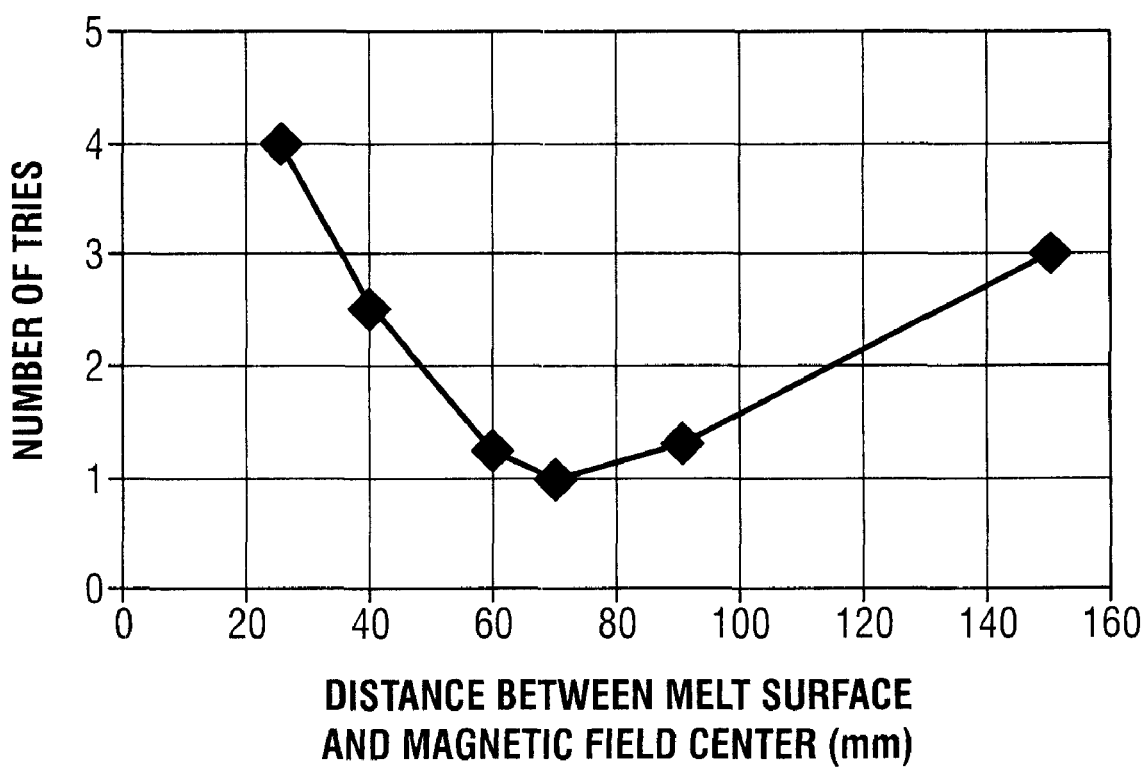
FIG. 3 is a diagram showing the relation between the magnetic field center distance and the number of tries in Examples 1 to 3 and Comparative Examples 1 to 3 of the present invention.

The relation between the magnetic field center distance H and the number of tries (average value) in Examples 1 to 3 and Comparative Examples 1 to 3 are shown in FIG. 3. The magnetic field center distance H, the number of tries (average value), the cycle time (average value), the good crystal yield rate (average value), and productivity (average value) in Examples 1 to 3 and Comparative Examples 1 and 2 are shown in below Table 2. The good crystal yield rate is the percentage of a good crystal part in the constant diameter part where no dislocation, Grown-in defects, and the like were generated. The productivity is the ratio of the weight of the good crystal part with respect to the cycle time and shows the weight of the good crystal part generated per unit time.

TABLE 2

|  | Example 1 | Example 2 | Example 3 | Comp. Example 1 | Comp. Example 2 | Comp. Example 3 |
| --- | --- | --- | --- | --- | --- | --- |
| Magnetic Field Center Distance H mm | 60 | 70 | 90 | 150 | 25 | 40 |
| Number of Tries | 1.25 | 1 | 1.33 | 3 | 4 | 2.5 |
| Cycle Time hr | 72 | 70 | 73 | 78.3 | 85.9 | 78 |
| Good Crystal Yield Rate % | 60 | 60 | 60 | 45 | 60 | 60 |
| Productivity kg/hr | 1.88 | 1.88 | 1.80 | 1.26 | 1.53 | 1.69 |

As it can be understood from above Table 2, in Examples 1 to 3 compared with Comparative Examples 1 to 3, good silicon single crystal ingots in which dislocation has not occurred in early stages of the pulling step can be created by smaller numbers of tries, and the cycle time can be shortened.

Moreover, in Examples 1 to 3, compared with the case like Comparative Example 1 in which the magnetic field axis 1 becomes lower than the lowest part of the silicon melt during pulling of the straight body part, the good crystal yield rate is high, the rate is higher by 15% in Example 2, and silicon single crystal ingots having large good crystal parts can be generated.

Moreover, in Examples 1 to 3, compared with the case like Comparative Example 2 in which the clearance between the surface of the silicon melt and the magnetic field axis is small, productivity of the good crystal part can be enhanced, and, in Example 2, the productivity is improved by about 19%.

Moreover, as shown in FIG. 3, the number of tries is rapidly reduced when the magnetic field center distance H is 40 to 60 mm, the number of tries is stable although slightly reduced when the magnetic field center distance H is 60 m to 70 mm, and the number of tries has a minimum value when the magnetic field center distance H is 70 mm. The number of tries is stable although slightly increased when the magnetic field center distance H is 70 to 90 mm which is in the vicinity of the remaining depth L of the silicon melt at the point of tail-in, and the number of tries is largely increased when the magnetic field center distance H is larger than 90.

Therefore, it can be understood that when the magnetic field center distance H is larger than 50 mm and equal to or less than the remaining depth L of the silicon melt at the point of tail-in, a single crystal which is totally free from dislocation and has a good crystal shape can be stably pulled.

According to FIG. 3, to stably pull a single crystal which is totally free from dislocation and which has a good crystal shape, the magnetic field center distance H is preferred to be 70 mm, and, as described above, since the remaining depth L of the silicon melt at the point of tail-in is equal to or more than 90 mm and equal to or less than 115 mm, the magnetic field center distance H is preferred to be larger than 50 mm and equal to or less than 90 mm.

As described above, according to the single crystal manufacturing method of the present invention, when the position of the magnetic field axis 1 which is the center of the applied horizontal magnetic field is lower than the liquid surface 3a of the silicon melt 3 by more than 50 mm and set at the position of the distance equal to or less than the depth L from the liquid surface 3a of the silicon melt 3 remaining in the crucible 4 at the point of tail-in, preferably, in the range of 50 mm to 90 mm, unstable convection of the silicon melt in an early stage of the pulling step of the silicon single crystal can be suppressed, thereby suppressing generation of dislocations in the pulled silicon single crystal. In addition, at least until the point of tail-in, the magnetic field center line 1 is not positioned below the lowest part 3b of the silicon melt 3, change of the crystal diameter of the silicon single crystal generated by the temperature change of the silicon melt can be suppressed, solidification of the silicon melt can be suppressed, and generation of dislocations in the silicon single crystal can be suppressed. Therefore, according to the manufacturing method of the single crystal according to the invention, a single crystal which is totally free from dislocation and has a good crystal shape can be stably pulled, thus improving yield and productivity.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

| [Description of Reference Numerals] | |
| --- | --- |
| 1 | Pulling chamber |
| 2 | Crystal take-out chamber |
| 3, 43, 53, 63, | Silicon melt |
| 3a, 44, 54, 64 | Liquid surface |
| 3b, 46, 56, 66 | Lowest part |
| 4, 41, 51, 61 | Crucible |
| 5 | Quartz crucible |
| 6 | Graphite crucible |
| 7, 42, 52, 62 | Ar gas current plate |
| 8 | Heating heater |
| 9 | Heat insulation material |
| 10 | Ar gas inlet |
| 11 | Ar gas discharge opening |

-continued

[Description of Reference Numerals]

| | |
|---|---|
| 12 | Diameter controlling camera |
| 13 | Wire |
| 14 | Crystal driving unit |
| 15 | Crucible driving unit |
| 16 | Horizontal magnetic field device |
| 17, 18 | Coil |
| 19 | Horizontal magnetic field position adjusting device |
| 20, 47, 57, 67 | Silicon single crystal |
| 21 | Straight body part |
| 22 | Neck part |
| 23 | Diameter-increasing unit |
| 30 | Seed Crystal |
| 45, 55, 65 | Magnetic field center position |
| 100 | Single crystal manufacturing apparatus |

What is claimed is:

1. A method for manufacturing a single crystal ingot by the Czochralski process from a raw material melt contained in a crucible within a pulling chamber, the raw material melt having a melt surface, comprising:

applying to the raw material melt, a horizontal magnetic field having a magnetic field axis, the magnetic field axis positioned at >50 mm and ≦90 mm below the melt surface;

pulling a single crystal from the raw material melt while maintaining the position of the melt surface constant by controlling a vertical position of the crucible;

maintaining the magnetic field axis at a constant distance H from the melt surface and equal to or less than a depth L from the melt surface of the raw material melt remaining in the crucible on completion of pulling of a constant diameter portion of the single crystal.

2. The method of claim 1, wherein the position of the magnetic field axis is set between 60 mm to 90 mm below the melt surface.

3. The method of claim 1, wherein the position of the magnetic field axis is set at a position between 70 mm to 90 mm below the melt surface.

4. The method of claim 1, wherein the position of the magnetic field axis is set at a position between 60 mm to 70 mm below the melt surface.

* * * * *